(12) United States Patent
Liu (10) Patent No.: US 12,136,555 B2
(45) Date of Patent: Nov. 5, 2024

(54) MATERIAL PROCESSING APPARATUS AND OPERATING METHOD THEREOF

(71) Applicant: Shao-Chi Liu, Kaohsiung (TW)

(72) Inventor: Shao-Chi Liu, Kaohsiung (TW)

( * ) Notice: Subject to any disclaimer, the term of this patent is extended or adjusted under 35 U.S.C. 154(b) by 835 days.

(21) Appl. No.: 17/202,362

(22) Filed: Mar. 16, 2021

(65) Prior Publication Data

US 2022/0028706 A1 Jan. 27, 2022

Related U.S. Application Data

(60) Provisional application No. 63/056,725, filed on Jul. 27, 2020.

(30) Foreign Application Priority Data

Sep. 3, 2020 (TW) ................................ 109130119

(51) Int. Cl.
*H01L 21/67* (2006.01)
*B01J 3/04* (2006.01)
(Continued)

(52) U.S. Cl.
CPC ..... *H01L 21/67092* (2013.01); *G05D 16/028* (2019.01); *G05D 23/1919* (2013.01); *G05D 27/02* (2013.01); *B01J 3/04* (2013.01)

(58) Field of Classification Search
CPC ............ H01L 21/67092; G05D 16/028; G05D 23/1919; G05D 27/02; B01J 3/04; H05K 2203/0195
See application file for complete search history.

(56) References Cited

U.S. PATENT DOCUMENTS

| 2009/0194090 A1* | 8/2009 | Kim | F24C 15/04 |
| | | | 165/104.34 |
| 2017/0205143 A1* | 7/2017 | Zielinski | F26B 25/22 |

(Continued)

FOREIGN PATENT DOCUMENTS

| CN | 104827742 | 8/2015 |
| CN | 205590569 | 9/2016 |

(Continued)

OTHER PUBLICATIONS

Office Action of Taiwan Counterpart Application, issued on May 19, 2021, pp. 1-7.

(Continued)

*Primary Examiner* — Daniel Samwel
(74) *Attorney, Agent, or Firm* — JCIP GLOBAL INC.

(57) ABSTRACT

A material processing apparatus includes a processing chamber having an internal space, an external pressure source, a vacuum generator, a temperature regulator and a controller. The external pressure source is connected to the processing chamber for positive pressure action on the internal space. The vacuum generator is connected to the processing chamber for negative pressure action on the internal space. The temperature regulator is arranged in the processing chamber to adjust the temperature in the internal space. The controller is configured to control the external pressure source to increase the pressure in the processing chamber from a normal pressure to a first predetermined pressure, and configured to control the vacuum generator to reduce the pressure in the processing chamber to a second predetermined pressure less than the normal pressure after the pressure rises to the first predetermined pressure. An operating method of a material processing apparatus is also provided.

18 Claims, 6 Drawing Sheets

(51) Int. Cl.
*G05D 16/00* (2006.01)
*G05D 23/19* (2006.01)
*G05D 27/02* (2006.01)

(56) References Cited

U.S. PATENT DOCUMENTS

2018/0249582 A1* 8/2018 Hung .................... H05K 3/305
2019/0360748 A1 11/2019 Miura et al.
2021/0116954 A1* 4/2021 Walsh .................... H02J 3/144

FOREIGN PATENT DOCUMENTS

| | | |
|---|---|---|
| CN | 109849257 | 2/2020 |
| JP | H1022305 | 1/1998 |
| JP | H11154785 | 6/1999 |
| JP | 2003017402 | 1/2003 |
| JP | 2011066438 | 3/2011 |
| JP | 2012248867 | 12/2012 |
| JP | 2015037195 | 2/2015 |
| JP | 2016111078 | 6/2016 |
| TW | 201508847 | 3/2015 |
| TW | 201714227 | 4/2017 |

OTHER PUBLICATIONS

"Office Action of Japan Counterpart Application", issued on May 6, 2022, p. 1-p. 5.
"Office Action of China Counterpart Application", issued on Sep. 9, 2024, p. 1-p. 10.

* cited by examiner

MATERIAL PROCESSING APPARATUS AND OPERATING METHOD THEREOF

CROSS-REFERENCE TO RELATED APPLICATION

This application claims the priority benefits of U.S. provisional application Ser. No. 63/056,725, filed on Jul. 27, 2020, and Taiwan application serial no. 109130119, filed on Sep. 3, 2020. The entirety of each of the above-mentioned patent applications is hereby incorporated by reference herein and made a part of this specification.

BACKGROUND

Technical Field

The disclosure relates to a processing apparatus and an operating method, and in particular to a material processing apparatus and an operating method thereof.

Related Art

Generally, during manufacture of an electronic product, a large number of bubbles are usually generated in a material to be processed, and these bubbles may reduce reliability and yield of the electronic product. Conventionally, negative pressure action (vacuuming) is often used to remove the bubbles. However, the above method is likely to reduce temperature uniformity of the material and cause an error between a measured temperature and an actual overall temperature of the material. As a result, accurate switching between related parameters cannot be performed, resulting in control inaccuracy.

SUMMARY

The disclosure provides a material processing apparatus and an operating method thereof, in which reliability and yield of an electronic product are able to be improved.

A material processing apparatus of the disclosure includes a processing chamber, an external pressure source, a vacuum generator, a temperature regulator and a controller. The processing chamber has an internal space. The external pressure source is connected to the processing chamber for positive pressure action on the internal space. The vacuum generator is connected to the processing chamber for negative pressure action on the internal space. The temperature regulator is arranged in the processing chamber and configured to adjust the temperature in the internal space. The controller is configured to control the external pressure source to increase the pressure in the processing chamber from a normal pressure to a first predetermined pressure, and configured to control the vacuum generator to, after the pressure in the processing chamber rises to the first predetermined pressure, reduce the pressure in the processing chamber to a second predetermined pressure less than the normal pressure.

In one embodiment of the disclosure, the material processing apparatus further includes at least one motor arranged outside the processing chamber and coupled to the processing chamber.

In one embodiment of the disclosure, the at least one motor is located in an atmospheric environment.

In one embodiment of the disclosure, the at least one motor is multiple motors, and one of the motors partially extends into the processing chamber.

In one embodiment of the disclosure, the material processing apparatus further includes a turbofan arranged in the processing chamber and connecting the temperature regulator and one of the motors.

In one embodiment of the disclosure, the at least one motor is a single motor, and the single motor is at a distance from the processing chamber.

In one embodiment of the disclosure, the material processing apparatus further includes a cooler arranged between the processing chamber and the vacuum generator and configured to cool gas pumped out of the processing chamber.

In one embodiment of the disclosure, the controller is configured to control the pressure in the processing chamber to be reduced to the second predetermined pressure before an electronic product is cooled.

In one embodiment of the disclosure, the controller is configured to control the pressure in the processing chamber to be reduced to the second predetermined pressure after an electronic product is cooled.

An operating method of a material processing apparatus of the disclosure may include the following. The material processing apparatus as described above is provided. An electronic product is placed in the processing chamber. The controller is operated to increase the pressure in the processing chamber from the normal pressure to the first predetermined pressure. After the pressure in the processing chamber rises to the first predetermined pressure, the controller is operated to reduce the pressure to the second predetermined pressure.

Based on the above, by the controller controlling the external pressure source to increase the pressure in the processing chamber from the normal pressure to the first predetermined pressure, a relatively uniform temperature is obtained throughout a material in a processing process of an electronic product (the temperature at the center of the material is close to the temperature at an edge of the material), so as to reduce an error between a measured temperature and an actual overall temperature of the material. Further, the material processing apparatus of the disclosure is able to accurately switch between related parameters, such that control inaccuracy is reduced, and reliability and yield of the electronic product are improved. In addition, after the external pressure source is controlled by the controller to increase the pressure in the processing chamber to the first predetermined pressure, by the controller controlling the vacuum generator to reduce the pressure in the processing chamber to the second predetermined pressure (at least less than the normal pressure), bubbles can be effectively removed from the material, thereby further improving the reliability and yield of the electronic product.

To make the aforementioned more comprehensible, embodiments accompanied with drawings are described in detail as follows.

DESCRIPTION OF THE EMBODIMENTS

Figure 1:
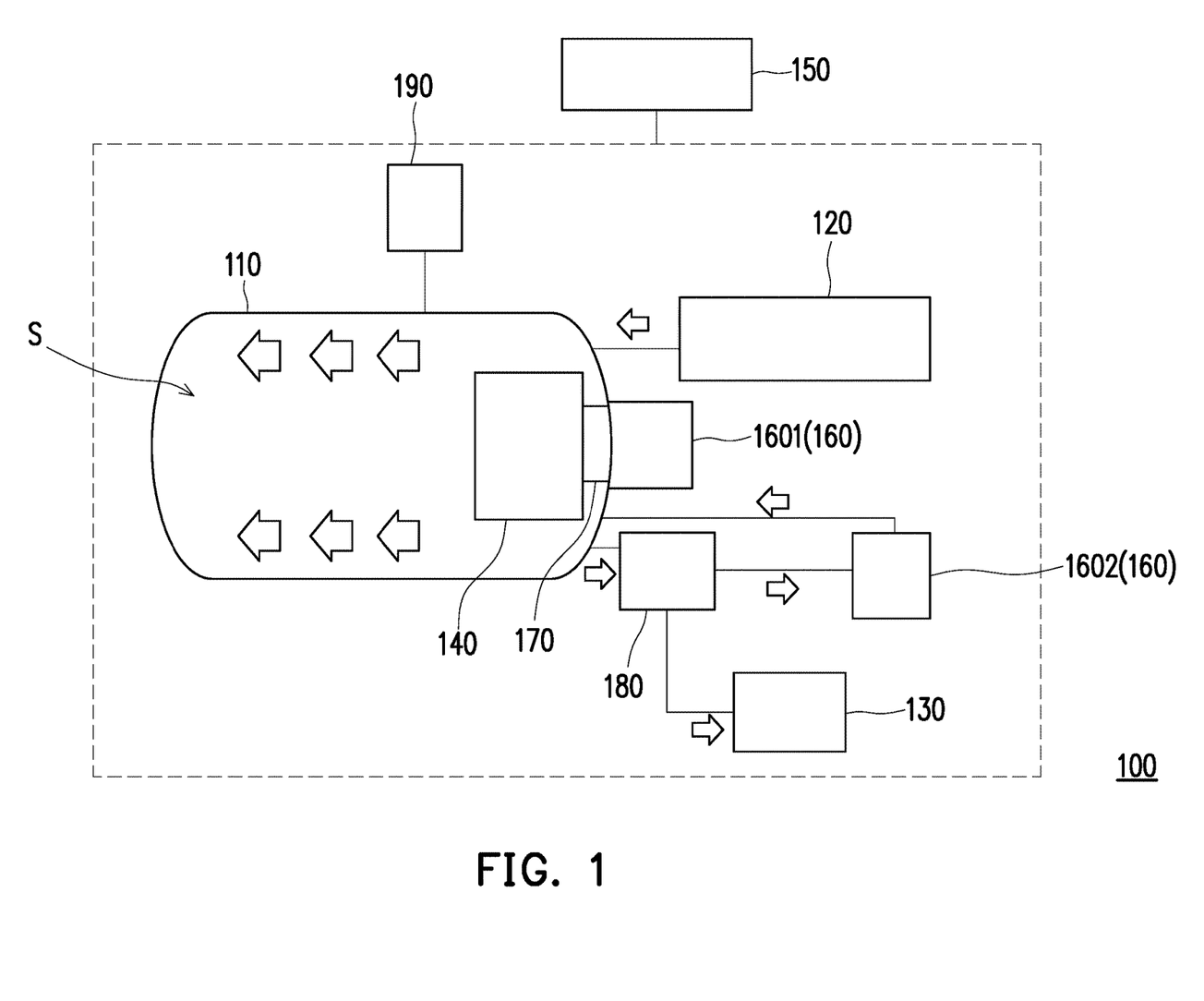
FIG. 1 is a block diagram of a material processing apparatus according to an embodiment of the disclosure.

FIG. 1 is a block diagram of a material processing apparatus according to an embodiment of the disclosure. The material processing apparatus herein is used in, for example, any related process for manufacturing an electronic product, such as front end of line (FEOL), back end of line (BEOL), and material processing of system-in-package (SiP) at the ball level and chip-on-wafer at the chip level. The electronic product includes, but is not limited to, an automotive electronic product or a sensing electronic product. The following description may be regarded as being of a processing process of an electronic product.

Referring to FIG. 1, a material processing apparatus 100 includes a processing chamber 110, an external pressure source 120, a vacuum generator 130, a temperature regulator 140, and a controller 150. Specifically, the processing chamber 110 has an internal space S. The external pressure source 120 is connected to the processing chamber 110 for positive pressure action on the internal space S. Herein, the positive pressure action may be to provide high-pressure gas to the internal space S of the processing chamber 110 by the external pressure source 120 so that the pressure in the internal space S is greater than a normal pressure. However, the disclosure is not limited thereto, and the external pressure source 120 may perform the positive pressure action on the internal space S in any other suitable manner. In some embodiments, the positive pressure action may cause the pressure in the internal space S to be within the range of 1 atmosphere to 100 atmospheres. However, the disclosure is not limited thereto. It is to be noted that the normal pressure mentioned in the disclosure is 1 atmosphere (atm).

The vacuum generator 130 is connected to the processing chamber 110 for negative pressure action on the internal space S. Herein, the negative pressure action may be to vacuum the internal space S of the processing chamber 110 by a vacuum pump so that the pressure in the internal space S is reduced to the normal pressure or less. However, the disclosure is not limited thereto, and the vacuum generator 130 may perform the negative pressure action on the internal space S in any other suitable manner.

The temperature regulator 140 is arranged in the processing chamber 110 to adjust the temperature in the internal space S. In the present embodiment, the temperature regulator 140, for example, performs hot air circulation in a convection manner for temperature adjustment, so as to make a gas temperature in the internal space S uniform. However, the disclosure is not limited thereto, and the temperature regulator 140 may perform temperature adjustment in other suitable manners.

The controller 150 is at least configured to control the external pressure source 120 and the vacuum generator 130. Specifically, the controller 150 may be configured to control the external pressure source 120 to increase the pressure in the processing chamber 110 from the normal pressure to a first predetermined pressure, and may be configured to control the vacuum generator 130 to, after the pressure in the processing chamber 110 rises to the first predetermined pressure, reduce the pressure in the processing chamber 110 to a second predetermined pressure less than the normal pressure.

By pressurizing the processing chamber 110, the density of heat molecules in the processing chamber 110 can be increased, such that the heat molecules evenly heat a material in a processing process of an electronic product. Therefore, by the controller 150 controlling the external pressure source 120 to increase the pressure in the processing chamber 110 from the normal pressure to the first predetermined pressure, a relatively uniform temperature is obtained throughout the material in the processing process of an electronic product (the temperature at the center of the material is close to the temperature at an edge of the material), so as to reduce an error between a measured temperature and an actual overall temperature of the material. Further, the material processing apparatus 100 of the present embodiment is able to accurately switch between related parameters, such that control inaccuracy is reduced, and reliability and yield of the electronic product are improved.

In addition, after controlling the external pressure source 120 by the controller 150 to increase the pressure in the processing chamber 110 to the first predetermined pressure, by the controller 150 controlling the vacuum generator 130 to reduce the pressure in the processing chamber 110 to the second predetermined pressure (at least less than the normal pressure), bubbles can be effectively removed from the material, thereby further improving the reliability and yield of the electronic product.

The controller 150 may be, for example, a central processing unit (CPU), or other programmable general purpose or special purpose microprocessor, a digital signal processor (DSP), a programmable controller, an application specific integrated circuit (ASIC), a programmable logic device (PLD), or other similar processing device, or a combination of the above, and may include a built-in memory or be connected to an external memory.

It is to be noted that time points when the pressure in the processing chamber 110 is increased from the normal pressure to the first predetermined pressure and when the pressure is reduced to the second predetermined pressure (at least less than the normal pressure) may be adjusted according to actual design requirements. For example, the pressure in the processing chamber 110 may be increased from the normal pressure to the first predetermined pressure when the pressure in the processing chamber 110 is adjusted for the first time in a process. For example, the pressure in the processing chamber 110 may be reduced to the second predetermined pressure (at least less than the normal pressure) when the pressure in the processing chamber 110 is adjusted for the nth time in the process, in which n>1 and n is an integer.

In some embodiments, for example, the pressure in the processing chamber 110 may be increased from the normal pressure to the first predetermined pressure when the pressure in the processing chamber 110 is adjusted for the first time in the process. For example, the pressure in the processing chamber 110 may be reduced to the second predetermined pressure (at least less than the normal pressure) when the pressure in the processing chamber 110 is adjusted for the second time in the process. That is, the pressure may be successively reduced to the second predetermined pressure (at least less than the normal pressure) after rising from the normal pressure to the first predetermined pressure.

In some embodiments, for example, the pressure in the processing chamber 110 may be increased from the normal pressure to the first predetermined pressure when the pressure in the processing chamber 110 is adjusted for the first time in the process. For example, the pressure in the processing chamber 110 may be reduced to the second predetermined pressure (at least less than the normal pressure)

when the pressure in the processing chamber 110 is adjusted for the third time or more in the process. That is, the pressure may be indirectly reduced to the second predetermined pressure (at least less than the normal pressure) after rising from the normal pressure to the first predetermined pressure.

In some embodiments, the pressure in the processing chamber 110 may be increased to the first predetermined pressure in, for example, a linear manner. However, the disclosure is not limited thereto. In other embodiments, the pressure in the processing chamber 110 may be increased to the first predetermined pressure in, for example, a multi-stage manner. Similarly, the pressure in the processing chamber 110 may be reduced to the second predetermined pressure in the linear manner or multi-stage manner.

Specifically, the vacuum (V), pressure (P), temperature (T) and time (t) in the disclosure may be adjusted according to material characteristics. The disclosure may cover all modifications in which the controller 150 is able to be configured to control the external pressure source 120 to increase the pressure in the processing chamber 110 from the normal pressure to the first predetermined pressure, and configured to control the vacuum generator 130 to, after the pressure in the processing chamber 110 rises to the first predetermined pressure, reduce the pressure in the processing chamber 110 to the second predetermined pressure less than the normal pressure.

In the present embodiment, the material processing apparatus 100 may optionally include at least one motor 160. The motor 160 may be arranged outside the processing chamber 110 and coupled to the processing chamber 110. In other words, the motor 160 may not be arranged in the internal space S. Therefore, compared to a motor arranged in the internal space S and having the same pressure as the internal space S, the motor 160 of the present embodiment is prevented from damage due to a pressure change in the internal space S, and thus has an extended service life. In some embodiments, the motor 160 may be coupled to the processing chamber 110 by a rotating shaft, a pipe, or other suitable connectors. However, the disclosure is not limited thereto.

In some embodiments, the motor 160 may be located in an atmospheric environment. That is, the motor 160 may not be covered by any housing and may be directly exposed to the air. However, the disclosure is not limited thereto. In other embodiments, the motor 160 may be covered by a housing so as to be prevented from being impacted and damaged by an external force.

In the present embodiment, the material processing apparatus 100 may optionally include a turbofan 170, and the at least one motor 160 may be multiple motors 160. Specifically, one of the motors 160 partially extends into the processing chamber 110, and the turbofan 170 may be arranged in the processing chamber 110 and may connect the temperature regulator 140 and one of the motors 160.

As shown in FIG. 1, the motor 160 may include a motor 1601 and a motor 1602, and the motor 1601 partially extends into the processing chamber 110. In addition, the turbofan 170 may be arranged in the processing chamber 110 and may connect the temperature regulator 140 and the motor 1601. In other words, the turbofan 170 may be sandwiched between the temperature regulator 140 and the motor 1601. The motor 1602 may be coupled to the processing chamber 110 to adjust a gas concentration in the processing chamber 110. For example, when the gas concentration in the processing chamber 110 is high, the controller 150 may control the motor 1602 to pump the gas out of the processing chamber 110. However, the disclosure is not limited thereto.

In some embodiments, the motor 1601 may be a drive motor, and may therefore drive the turbofan 170 to rotate to achieve a uniform gas temperature in the internal space S. However, the disclosure is not limited thereto.

In the present embodiment, the material processing apparatus 100 may optionally include a cooler 180. The cooler 180 may be arranged between the processing chamber 110 and the vacuum generator 130 and configured to cool the gas pumped out of the processing chamber 110. In addition, the cooler 180 may be arranged outside the processing chamber 110 and connected to the internal space S. Thus, the gas cooled by the cooler 180 may flow back to the processing chamber 110 for circulation. In some embodiments, the cooler 180 may be a plate heat exchanger. However, the disclosure is not limited thereto, and the cooler 180 may be any suitable cooling device.

In the present embodiment, the material processing apparatus 100 may optionally include a gas content sensor 190. The gas content sensor 190 may be arranged outside the processing chamber 110 and may communicate with the internal space S. Specifically, the gas content sensor 190 may sense the content of a specific gas in the internal space S. The gas content sensor 190 may include an adjustment unit (not shown) that adjusts a specific fluid to a state suitable for being sensed before sensing the content of the fluid. The adjustment unit is, for example, a valve element configured to allow a fluid having an appropriate flow rate to pass therethrough to be sensed. Alternatively, the adjustment unit is, for example, a temperature adjustment unit configured to raise or lower the temperature to adjust the fluid to a temperature range suitable for being sensed.

In some embodiments, the gas content sensor 190 is, for example, an oxygen content analyzer. The type and components of the gas content sensor 190 as well as the type of gas to be measured by the gas content sensor 190 are not limited to the above.

It is to be noted that, in addition to controlling the external pressure source 120 and the vacuum generator 130, the controller 150 is also selectively configured to control the elements such as the temperature regulator 140, the motor 160, the turbofan 170, the cooler 180, and the gas content sensor 190, so as to achieve an accurate and fast parameter switching mechanism. However, the disclosure is not limited thereto.

It is to be noted that the reference numerals and a part of the content of the above embodiment apply to the following embodiments, in which the same or similar reference numerals denote the same or similar elements, and repeated description of the same technical content is omitted. For an understanding of the omitted description, reference may be made to the description of the previous embodiment, and no repeated description is contained in the following embodiments.

Figure 2:
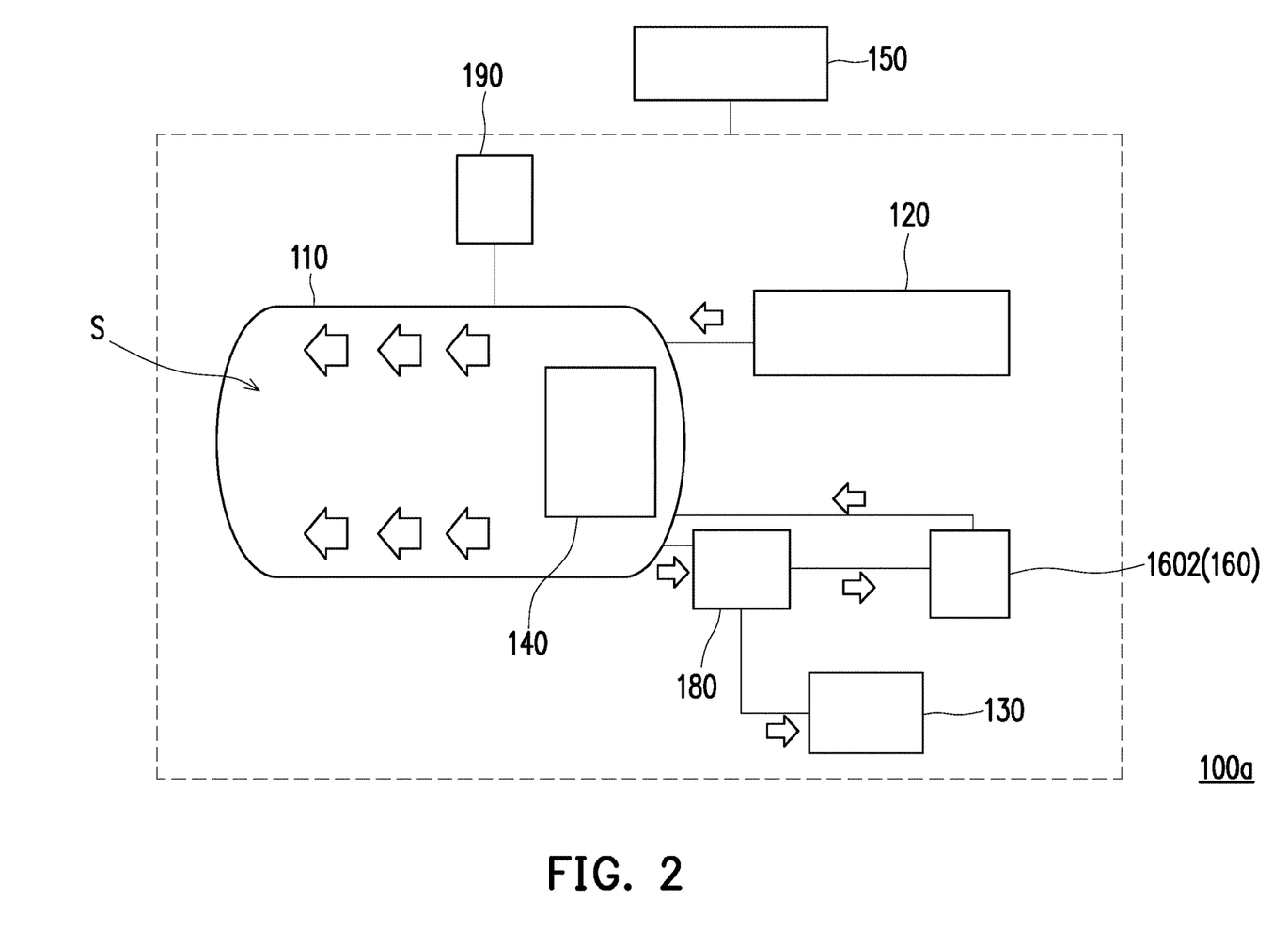
FIG. 2 is a block diagram of a material processing apparatus according to another embodiment of the disclosure.

FIG. 2 is a block diagram of a material processing apparatus according to another embodiment of the disclosure. Referring to FIG. 2, a material processing apparatus 100a of the present embodiment differs from the material processing apparatus 100 of the embodiment of FIG. 1 in that the at least one motor 160 is a single motor 160, and the motor 160 is at a distance from the processing chamber 110. Specifically, in the present embodiment, the material processing apparatus 100a excludes the turbofan 170 and the motor 1601 driving the turbofan 170. In addition, the motor 1602 may be connected to the cooler 180, such that the motor 1602 may be directly used to adjust the gas in the processing chamber 110 and flow the cooled gas from the cooler 180 back to the processing chamber 110 for circulation.

By arranging the material processing apparatus 100a of the present embodiment, the number of motors used can be reduced, and the manufacturing cost of the material processing apparatus 100a can therefore be effectively reduced. However, in the disclosure, the number and position of motors are not limited and may be adjusted according to actual design requirements.

Figure 3:
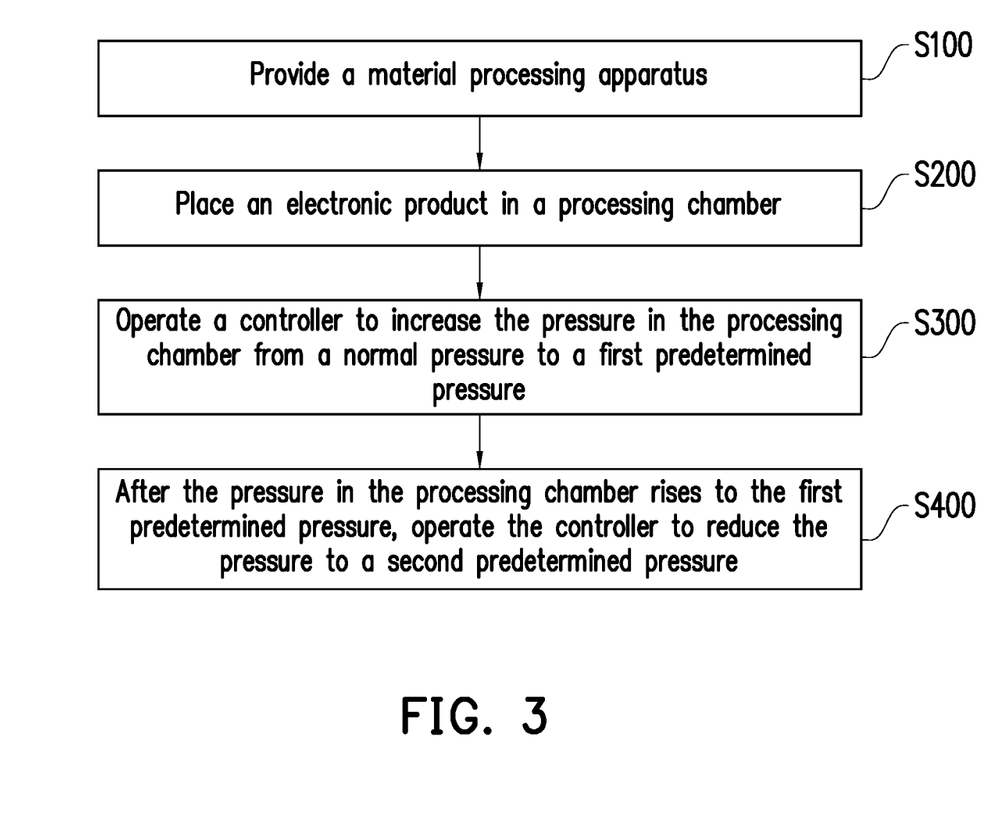
FIG. 3 is a flowchart of an operating method of a material processing apparatus according to an embodiment of the disclosure.

An operating method of a material processing apparatus according to an embodiment of the disclosure is hereinafter described with reference to the drawings. FIG. 3 is a flowchart of an operating method of a material processing apparatus according to an embodiment of the disclosure.

Referring to FIG. 3, step S100 is performed in which a material processing apparatus such as the material processing apparatus 100 or the material processing apparatus 100a is provided. Step S200 is performed in which an electronic product is placed in the processing chamber 110. Step S300 is performed in which the controller 150 is operated to increase the pressure in the processing chamber 110 from the normal pressure to the first predetermined pressure. Step S400 is performed in which, after the pressure in the processing chamber 110 rises to the first predetermined pressure, the controller 150 is operated to reduce the pressure to the second predetermined pressure.

In the present embodiment, by the controller 150 controlling the external pressure source to increase the pressure in the processing chamber 110 from the normal pressure to the first predetermined pressure, a relatively uniform temperature is obtained throughout the material in the processing process of the electronic product (the temperature at the center of the material is close to the temperature at an edge of the material), so as to reduce an error between a measured temperature and an actual overall temperature of the material. Further, the material processing apparatus 100 or the material processing apparatus 100a of the disclosure is able to accurately switch between related parameters, such that control inaccuracy is reduced, and reliability and yield of the electronic product are improved. In addition, after the pressure in the processing chamber 110 rises to the first predetermined pressure, by the controller 150 controlling the vacuum generator to reduce the pressure in the processing chamber 110 to the second predetermined pressure (at least less than the normal pressure), bubbles can be effectively removed from the material, thereby further improving the reliability and yield of the electronic product.

Figure 4A:
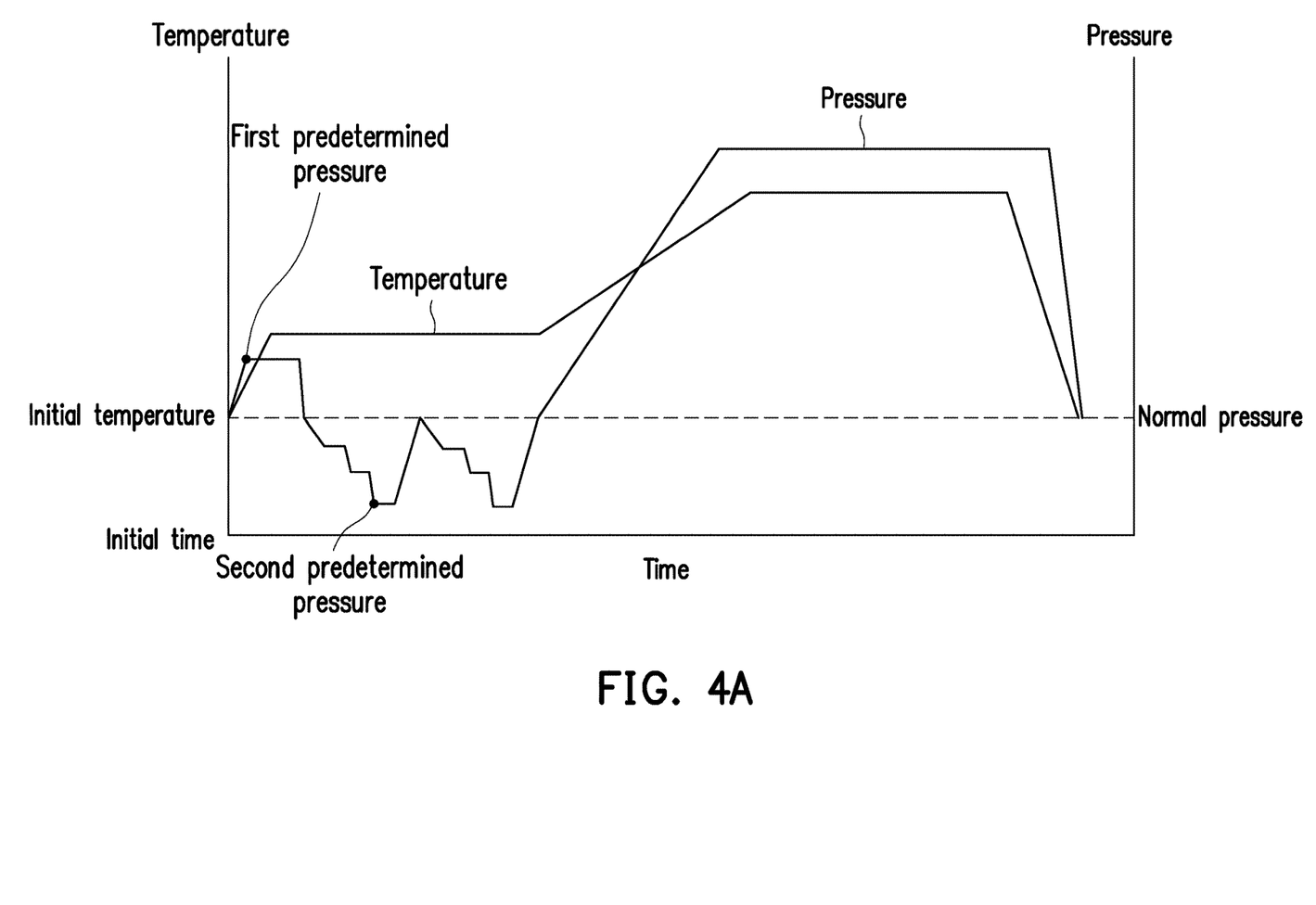
FIG. 4A to FIG. 4C are graphs of a relationship between temperature, pressure and time according to some embodiments of the disclosure.
Figure 4B:
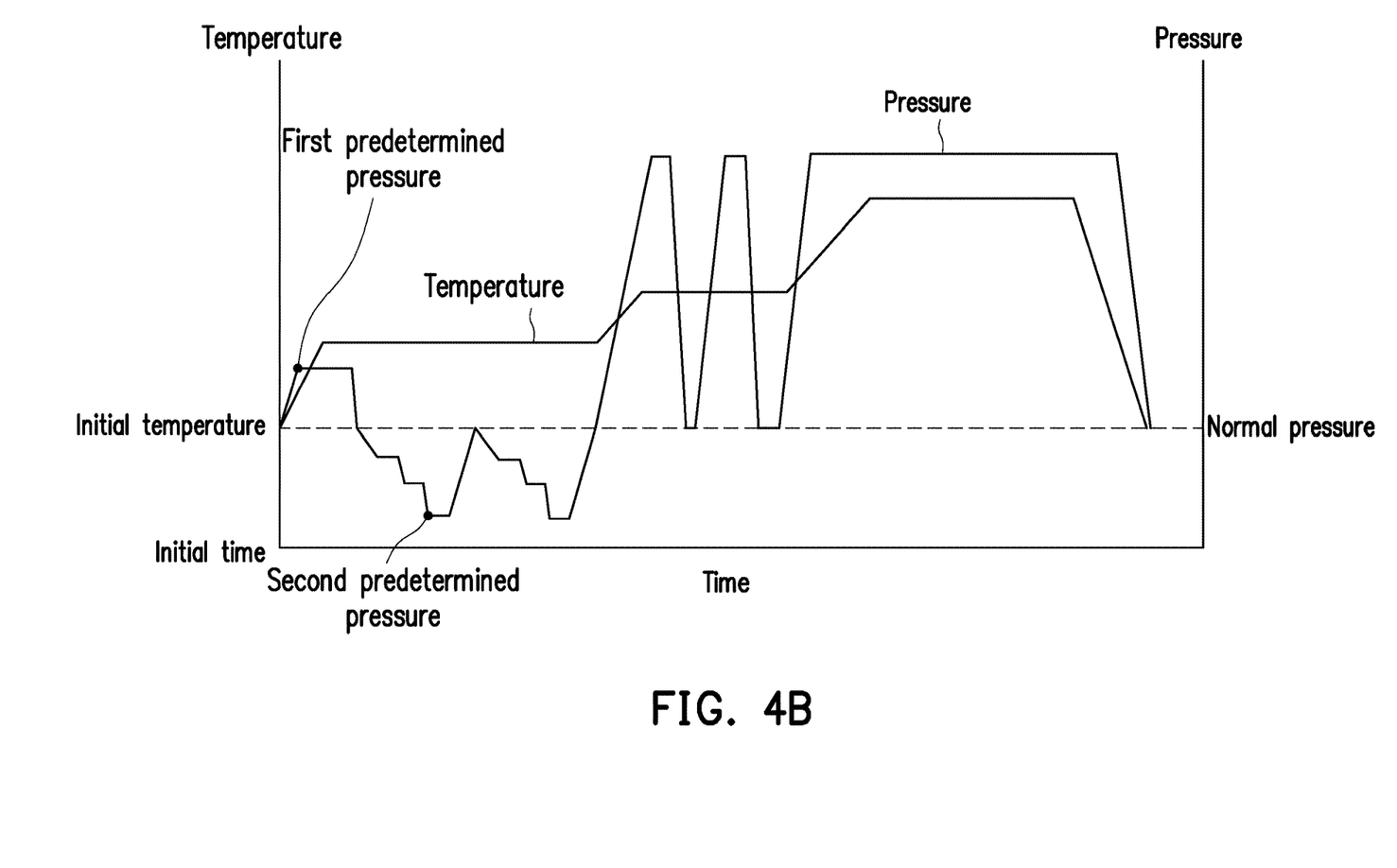
Figure 4C:
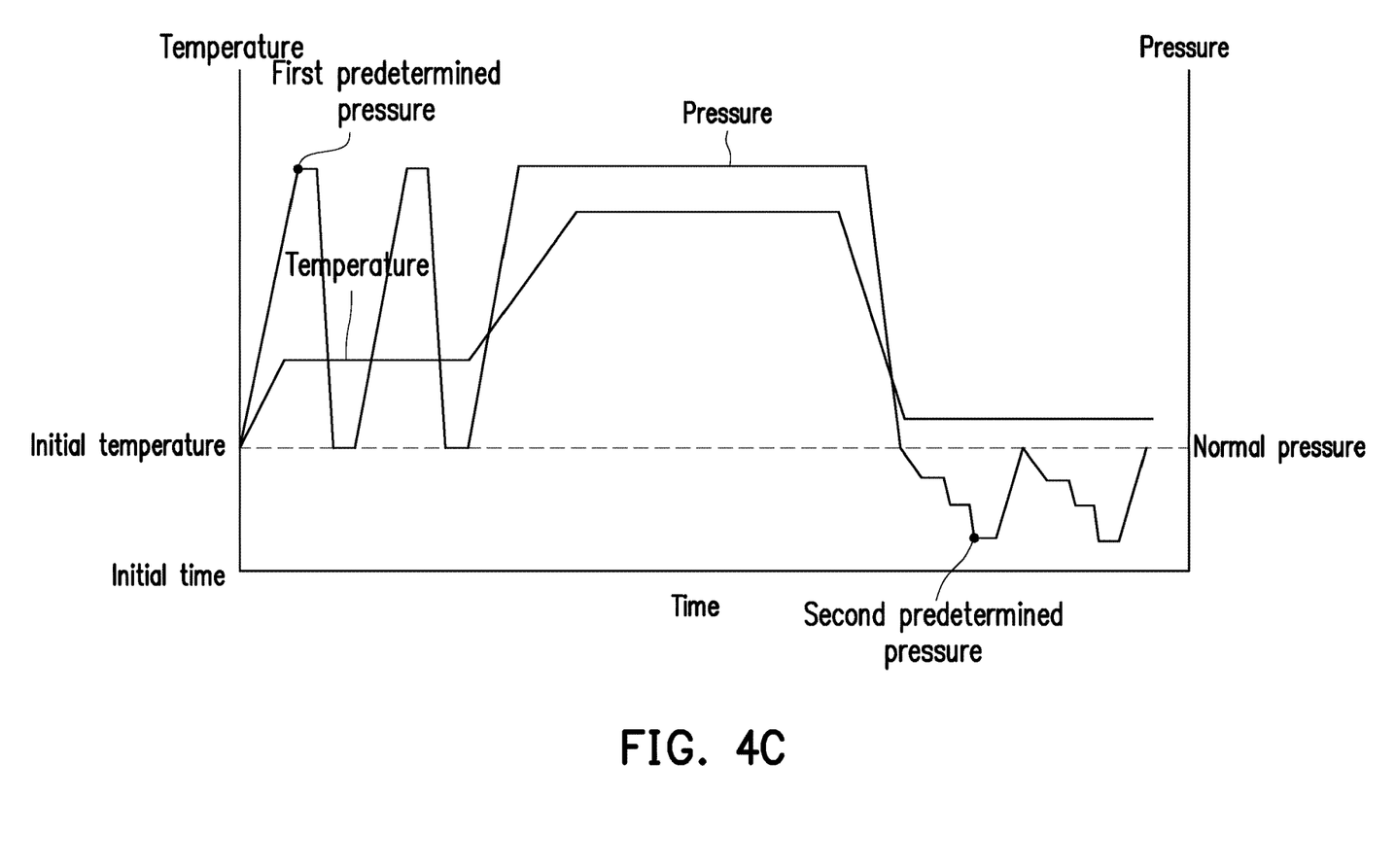

Operating curves in some examples of the disclosure are hereinafter described with reference to the drawings. FIG. 4A to FIG. 4C are graphs of a relationship between temperature, pressure and time according to some embodiments of the disclosure.

Referring to FIG. 4A, operating curves in FIG. 4A illustrate material processing of an underfill process for manufacturing an electronic product. The material is, for example, a capillary underfill (CUF), and the underfill process is, for example, a process of filling an adhesive material between an electronic component and a substrate. In some embodiments, the capillary underfill is, for example, a polymer material, resin or a silicon dioxide additive. However, the disclosure is not limited thereto.

Referring to FIG. 4B, operating curves in FIG. 4B illustrate material processing of coating, printing, and potting processes for manufacturing an electronic product. The material may be one known to those skilled in the art as being applied to the above-mentioned processes, and a description thereof is omitted herein.

Specifically, as shown in FIG. 4A and FIG. 4B, according to material characteristics of the above-mentioned processes, the controller 150 may be configured to control the pressure in the processing chamber 110 to be reduced to the second predetermined pressure before the electronic product is cooled. That is, after the pressure in the processing chamber 110 rises to the first predetermined pressure, the controller 150 may control the temperature regulator 140 to adjust the temperature in the internal space S so that the temperature in the internal space S is maintained or continues to rise, and may control the vacuum generator 130 to perform negative pressure action on the internal space S so that the pressure in the internal space S is reduced from the first predetermined pressure to the second predetermined pressure (at least less than normal pressure).

Referring to FIG. 4C, operating curves in FIG. 4C illustrate material processing of a process for manufacturing an electronic product (sensor). The material is, for example, silica gel. Specifically, as shown in FIG. 4C, according to material characteristics of this process, the controller 150 may be configured to control the pressure in the processing chamber 110 to be reduced to the second predetermined pressure after the electronic product is cooled. That is, after the pressure in the processing chamber 110 rises to the first predetermined pressure, the temperature in the internal space S may continue to rise to a certain temperature before cooling is performed. Meanwhile, the pressure may alternately rise and drop without dropping below the normal pressure. After the electronic product is cooled, the pressure in the internal space S is reduced from the first predetermined pressure to the second predetermined pressure (at least less than the normal pressure).

When the material in the processing process of the electronic product is the aforementioned adhesive material with relatively high viscosity, a binding force between the bubbles and the material is increased. Therefore, the material processing apparatus of the disclosure is applied. By the controller controlling the external pressure source to increase the pressure in the processing chamber to the first predetermined pressure, when a softening point of the material is reached during heating, flowability of the material in the processing process of the electronic product can be improved and the binding force of the material with respect to the bubbles can be reduced. After the pressure in the processing chamber rises to the first predetermined pressure, by the controller controlling the vacuum generator to reduce the pressure in the processing chamber to the second predetermined pressure (at least less than the normal pressure), the bubbles can be effectively removed from the material, thereby further improving the reliability and yield of the electronic product.

In addition, in the embodiments of FIG. 4A to FIG. 4C, the pressure may be maintained at a fixed value (with no depressurization being performed) during initial cooling. Therefore, during initial cooling, warpage due to thermal reaction can be effectively prevented from occurring or bubbles can be effectively prevented from recovering, thereby further ensuring the reliability and yield of the electronic product.

It is to be noted that the first predetermined pressure and the second predetermined pressure labeled in FIG. 4A to FIG. 4C only schematically show the curves related to the temperature, pressure and time corresponding to the material characteristics of the material in the processing process of the electronic product. The values of the temperature, pressure and time may be adjusted according to actual design requirements. Hence, FIG. 4A to FIG. 4C do not explicitly indicate the values of the temperature, pressure, and time at each node. In addition, the first predetermined pressure may be defined as being at a position of a first highest point in the pressure curve, and the second predetermined pressure may be defined as being at a position of a first lowest point when the pressure in the pressure curve is less than normal pressure for the first time.

The relationship between temperature and pressure is not limited to those shown by the curves in FIG. 4A to FIG. 4C (for example, increasing the pressure in the processing chamber 110 from the normal pressure to the first predetermined pressure at the same time as heating the electronic product). That is, the time points of the temperature adjustment and the pressurization may be determined according to actual design requirements. The disclosure may cover all modifications in which the controller 150 is able to be operated to increase the pressure in the processing chamber 110 from the normal pressure to the first predetermined pressure, and the controller 150 is able to be operated to, after the pressure in the processing chamber 110 rises to the first predetermined pressure, reduce the pressure in the processing chamber 110 to the second predetermined pressure. For example, the temperature may be increased to a certain temperature before the pressure in the processing chamber 110 is increased, or the pressure in the processing chamber 110 may be increased to a certain pressure before the temperature in the processing chamber 110 is raised.

In summary, by the controller controlling the external pressure source to increase the pressure in the processing chamber from the normal pressure to the first predetermined pressure, a relatively uniform temperature is obtained throughout a material in a processing process of an electronic product (the temperature at the center of the material is close to the temperature at an edge of the material), so as to reduce an error between a measured temperature and an actual overall temperature of the material. Further, the material processing apparatus of the disclosure is able to accurately switch between related parameters, such that control inaccuracy is reduced, and reliability and yield of the electronic product are improved. In the case where the material in the processing process of the electronic product is an adhesive material with relatively high viscosity, by the controller controlling the external pressure source to increase the pressure in the processing chamber to the first predetermined pressure, when a softening point of the material is reached during heating, flowability of the adhesive material can be improved. After the pressure in the processing chamber rises to the first predetermined pressure, by the controller controlling the vacuum generator to reduce the pressure in the processing chamber to the second predetermined pressure (at least less than the normal pressure), bubbles can be effectively removed from the material, thereby further improving the reliability and yield of the electronic product.

Although the disclosure has been described with reference to embodiments thereof, it will be apparent to one of ordinary skill in the art that modifications and variations may be made without departing from the spirit of the disclosure. Accordingly, the scope of the disclosure will be defined by the attached claims.

What is claimed is:

1. A material processing apparatus, comprising:
   a processing chamber, having an internal space;
   an external pressure source, connected to the processing chamber for positive pressure action on the internal space;
   a vacuum generator, connected to the processing chamber for negative pressure action on the internal space;
   a temperature regulator, arranged in the processing chamber and configured to adjust a temperature in the internal space; and
   a controller, configured to control the external pressure source to increase a pressure in the processing chamber from a normal pressure to a first predetermined pressure during initial heating within the processing chamber, and configured to control the vacuum generator to, after the pressure in the processing chamber rises to the first predetermined pressure, reduce the pressure in the processing chamber to a second predetermined pressure less than the normal pressure.

2. The material processing apparatus according to claim 1, further comprising at least one motor arranged outside the processing chamber and coupled to the processing chamber.

3. The material processing apparatus according to claim 2, wherein the at least one motor is located in an atmospheric environment.

4. The material processing apparatus according to claim 2, wherein the at least one motor is a plurality of motors, and one of the plurality of motors partially extends into the processing chamber.

5. The material processing apparatus according to claim 4, further comprising a turbofan arranged in the processing chamber and connecting the temperature regulator and one of the plurality of motors.

6. The material processing apparatus according to claim 2, wherein the at least one motor is a single motor, and the single motor is at a distance from the processing chamber.

7. The material processing apparatus according to claim 1, further comprising a cooler arranged between the processing chamber and the vacuum generator and configured to cool gas pumped out of the processing chamber.

8. The material processing apparatus according to claim 1, wherein the controller is configured to control the pressure in the processing chamber to be reduced to the second predetermined pressure before an electronic product is cooled.

9. The material processing apparatus according to claim 1, wherein the controller is configured to control the pressure in the processing chamber to be reduced to the second predetermined pressure after an electronic product is cooled.

10. An operating method of a material processing apparatus, comprising:
    providing a material processing apparatus, wherein the material processing apparatus comprises:
      a processing chamber, having an internal space;
      an external pressure source, connected to the processing chamber for positive pressure action on the internal space;
      a vacuum generator, connected to the processing chamber for negative pressure action on the internal space;
      a temperature regulator, arranged in the processing chamber and configured to adjust a temperature in the internal space; and
      a controller, configured to control the external pressure source to increase a pressure in the processing chamber from a normal pressure to a first predetermined pressure during initial heating within the processing chamber, and configured to control the vacuum generator to, after the pressure in the processing chamber rises to the first predetermined pressure, reduce the pressure in the processing chamber to a second predetermined pressure less than the normal pressure;

placing an electronic product in the processing chamber;

operating the controller to increase the pressure in the processing chamber from the normal pressure to the first predetermined pressure; and after the pressure in the processing chamber rises to the first predetermined pressure, operating the controller to reduce the pressure in the processing chamber to the second predetermined pressure.

11. The operating method of a material processing apparatus according to claim 10, wherein the material processing apparatus further comprises at least one motor arranged outside the processing chamber and coupled to the processing chamber.

12. The operating method of a material processing apparatus according to claim 11, wherein the at least one motor is located in an atmospheric environment.

13. The operating method of a material processing apparatus according to claim 11, wherein the at least one motor is a plurality of motors, and one of the plurality of motors partially extends into the processing chamber.

14. The operating method of a material processing apparatus according to claim 13, wherein the material processing apparatus further comprises a turbofan arranged in the processing chamber and connecting the temperature regulator and one of the plurality of motors.

15. The operating method of a material processing apparatus according to claim 11, wherein the at least one motor is a single motor, and the single motor is at a distance from the processing chamber.

16. The operating method of a material processing apparatus according to claim 10, wherein the material processing apparatus further comprises a cooler arranged between the processing chamber and the vacuum generator and configured to cool gas pumped out of the processing chamber.

17. The operating method of a material processing apparatus according to claim 10, wherein the controller is configured to control the pressure in the processing chamber to be reduced to the second predetermined pressure before the electronic product is cooled.

18. The operating method of a material processing apparatus according to claim 10, wherein the controller is configured to control the pressure in the processing chamber to be reduced to the second predetermined pressure after the electronic product is cooled.

* * * * *